United States Patent

Mosser et al.

Patent Number: 5,442,221
Date of Patent: Aug. 15, 1995

[54] HALL EFFECT SENSOR

[75] Inventors: Vincent Mosser, Le Plessis Robinson; Jean-Louis Robert, Le Cres, both of France

[73] Assignee: Schlumberger Industries, S.A., Montrouge, France

[21] Appl. No.: 65,003

[22] Filed: May 24, 1993

[30] Foreign Application Priority Data

May 27, 1992 [FR] France .................... 92 06171

[51] Int. Cl.$^6$ .............. H01L 27/22; H01L 43/00
[52] U.S. Cl. ........................ 257/425; 257/14; 257/15; 257/190; 257/421; 257/426; 324/260; 324/252; 338/32 H
[58] Field of Search ............... 257/14, 15, 18, 22, 257/425, 190, 194, 422, 414, 421, 425, 426; 338/32 R, 32 H; 324/252, 260

[56] References Cited

U.S. PATENT DOCUMENTS

| 4,823,171 | 4/1989 | Matsui ................... 257/24 |
| 4,878,095 | 10/1989 | Bending et al. ............ 257/194 |
| 4,882,609 | 11/1989 | Schubert et al. ........... 257/194 |
| 4,912,451 | 3/1990 | Sugiyama et al. .......... 338/32 R |
| 4,928,154 | 5/1990 | Umeno et al. ............. 257/22 |
| 5,107,514 | 4/1992 | Goto ..................... 257/22 |
| 5,343,057 | 8/1994 | Gerard et al. ............ 257/194 |

FOREIGN PATENT DOCUMENTS

| 61-20378 | 1/1986 | Japan ................ 338/32 H |
| 62-093989 | 4/1987 | Japan . |
| 63-054785 | 3/1988 | Japan . |
| 64-125003 | 12/1990 | Japan ................ 257/22 |

OTHER PUBLICATIONS

Lau et al., "Low-Resistance Non-Spiking Ohmic Contact for AlGaAs/GaAs High Electron Mobility Transistors Using the Ge/Pcl Scheme," *Applied Physics Letters*, 54, Jun. 26, 1989 pp. 2677-2679.

Sze, S. M. *Semiconductor Devices Physics and Technology*, 1985 p. 513.

Patent Abstract of Japan, vol. 12, No. 273, Jul. 29, 1988, JP-A-63054785 (Agency of Ind. Science & Technology, Mar. 9, 1988.

Patent Abstract of Japan vol. 11, No. 294 (E-544) Sep. 22, 1987 JP-A-52-093-989 (Hatachi Ltd.) Apr. 30, 1987.

*Primary Examiner*—Sara W. Crane
*Assistant Examiner*—John Guay
*Attorney, Agent, or Firm*—Sanford J. Asman

[57] ABSTRACT

A Hall effect sensor of two-dimensional electron gas type comprising, on an insulating substrate, a quantum well structure, a carrier injection layer adjacent to the quantum well structure, of thickness less than 250 Å and having an density per unit area of donors integrated over the whole thickness of the carrier injection layer less than $5 \times 10^{12}$ cm$^{-2}$, an insulating burial layer deposited on the carrier injection layer, having a conduction band with an energy level greater than the Fermi energy of the sensor and a thickness greater than 200 Å. Applicable to the field of electricity meters and current sensors.

18 Claims, 4 Drawing Sheets

HALL EFFECT SENSOR

The present invention concerns a Hall effect sensor. It is applicable particularly to the fields of electric current measurement and metering electrical energy and applicable more particularly to electricity meters.

BACKGROUND OF THE INVENTION

It is known that a Hall effect sensor passing an energizing current (or equivalently subjected to a voltage) and subjected to a magnetic field perpendicular to the direction of current flow generates a so-called Hall voltage at its terminals in a third direction in space perpendicular to the directions of the magnetic field and the current flow.

The Hall voltage $V_H$ is proportional to the product of the strength $I_a$ of the energizing current (or equivalently the amplitude of the energizing voltage $V_a$) and the amplitude of the magnetic field B. In an ideal sensor we thus have:

$$V_H = K_i \cdot B \cdot I_a = K_v \cdot B \cdot V_a \qquad (1)$$

with $K_i = 1/(e \cdot n_s)$, where e is the charge on an electron and $n_s$ is the density per unit area of the charge carriers and $K_v = (W/L)\mu$, where W and L are the width and the length of the sensor and $\mu$ is the mobility of the charge carriers. In a real Hall effect sensor having inhomogeneities or misalignment of the electrodes inherent in the manufacturing process, the Hall voltage is written:

$$V_H = K_i \cdot I_a \cdot B(1 + f/\mu B) \qquad (2)$$

where the parameter f, small compared with 1, takes account of the departure from the ideal situation.

In order to obtain good sensitivity, a low carrier density per unit area is necessary.

This may be effected for example using a semiconductor structure comprising a homogeneous conductive layer of small thickness (in the order of a micrometer). This layer may be a layer of silicon for example, doped n-type on a substrate of p-type, or equally a layer of GaAs doped n-type on a semi-insulating GaAs substrate.

It may equally be effected using a hetero-structure semiconductor comprising at least two superimposed layers of semiconductor material having forbidden bands of different widths and selectively doped in the material with the widest forbidden band.

In this case, the carriers are confined to a very narrow region (whose thickness may be from 10 Å to 100 Å) located at the interface between the two materials, on the side of the material with the smallest forbidden band.

The sensor of the invention is of this second type.

The reference U.S. Pat. No. 4,912,451 describes a heterostructure comprising at least two quantum wells: a first quantum well formed at the interface between two semiconductor layers with forbidden bands of different widths and in which there is a two-dimensional electron gas, and a second quantum well whose "sub-band" has an energy level in its fundamental state higher than that of the two-dimensional electron gas.

This hetero-structure has a high sensitivity as a Hall effect sensor. It does not saturate, even under the influence of a strong electric field and it provides a strong output signal even in this case. However, this heterostructure is sensitive to temperature variations, which affect the output signal. This Hall effect sensor has to be connected to a sophisticated and expensive electronic unit to compensate for the drift in the output signal when the temperature varies.

The article "AlGaAs:GaAs heterojunction Hall device" by T. Taguchi, published in Electronics and Communications in Japan, Part 2, Vol. 71, No. 3, 1988, pp 110–115, describes a simple AlGaAs/GaAs heterojunction used as a magnetic field sensor. As above, this structure may have increased sensitivity but it does not have good thermal characteristics. If made to operate at ambient temperature, it requires an electronic compensation unit if the temperature is subject to variations. By way of example, the coefficient of sensitivity to temperature mentioned in that article is 6800 ppm/°C.

Another article "Highly sensitive 2DEG Hall device made of pseudomorphic $In_{0.52}Al_{0.48}As/In_{0.8}Ga_{0.2}As$ heterostructure" authored by Sugiyanama et al. and published in "International Conference on Solid-State Sensors and Actuators", Transducers '91, San Francisco, Digest of Technical Papers, IEEE Publication Office, describes a pseudomorphic $In_{0.52}Al_{0.48}As/In_{0.8}Ga_{0.2}As$ heterostructure deposited on an InP substrate. Although the performance as a function of temperature is improved compared with that of the two preceding references, it remains inadequate for application to an electricity meter, for which the required specifications are very demanding. By way of example, the coefficient of sensitivity to temperature of such a structure is 350 ppm/°C. over a temperature range not exceeding 55° C.

OBJECT AND SUMMARY OF THE INVENTION

The object of the present invention is to provide a Hall effect sensor having a low sensitivity to temperature (coefficient of sensitivity to temperature less than 150 ppm/°C.) over an extended temperature range (from at least −50° C. to 120° C.).

On the other hand, the present invention also has the object of providing a Hall effect structure of high sensitivity and low power consumption.

Another object of the invention is to provided a Hall effect structure having a small offset voltage, or in any case less than that of a prior art sensor for a given geometry.

In general terms, the invention provides a structure which minimizes the corrections or other processing to be applied to the measurement for metering electrical energy or measuring an electric current, in a marked manner compared with the prior art.

More precisely the present invention concerns a Hall effect sensor comprising: A quantum well structure having a first layer of a III-V semiconductor material, a second layer of a III-V semiconductor material, and a third layer of a III-V semiconductor material epitaxially deposited on a semiconductor substrate, and such that the material of the second layer has a forbidden band narrower than that of the materials of the first and second layers, further comprising, superimposed on the third layer, a fourth layer of III-V semiconductor material referred to as the carrier injection layer, doped with n-donor type impurities, of thickness less than 250 Å and possibly zero, and whose carrier density per unit area integrated over the whole carrier injection layer is less than $5 \times 10^{12} cm^{-2}$, and also comprising, superimposed on this carrier injection layer, a fifth layer of III-V semiconductor material with a thickness greater than 200 Å, called the burial layer, which is not doped or is doped with acceptor type impurities, such that the conduction band of this layer shall always have higher energy, for example by at least 150 meV, than the energy of the conduction band in the quantum well.

Between the substrate and the set of layers forming the quantum well there is a layer, called a buffer layer, of total thickness in the order of some thousands of Å and whose role is to ensure good flatness and good crystal quality of the following epitaxial layers.

In known manner, this layer may be either a homogeneous un-doped layer of III-V material or it may itself be formed by stacked layers, such as for example an AlAs/GaAs superlattice, or any combination of homogeneous and super-lattice layers.

In a first embodiment, the quantum well structure has an asymmetric well: The first layer is of binary or ternary III-V semiconductor material. The second layer is of ternary III-V semiconductor material with a narrower forbidden band than the first layer and the third layer is of ternary material with a wider forbidden band than the second layer. The so-called carrier injection layer is a layer of doped ternary material and the burial layer is a layer of ternary material with a wide forbidden band or a layer of ternary material with a composition gradient.

According to another embodiment, the quantum well structure is symmetrical and comprises first and third substantially identical layers of a material with a wider forbidden band on the two sides respectively of the second layer of a material with a narrower forbidden band.

In this case, in addition to the layers already mentioned, another carrier injection layer may be provided between the buffer layer and the quantum well structure.

BRIEF DESCRIPTION OF THE DRAWINGS

The invention will be better understood from a reading of the following description, given by way of non-limiting example with reference to the accompanying drawings, in which.

MORE DETAILED DESCRIPTION

A Hall effect sensor in conformity with the invention comprises a stack of layers deposited on a substrate by any known technique, such as molecular beam epitaxy or metallo-organic chemical vapor deposition.

The homogeneity of the layers as well as the uniformity of doping obtained by these techniques are excellent, which enables the offset of the Hall effect sensor due to these parameters to be reduced.

In this manner, the calibration operations are simplified and the cost of electronic compensation circuits is reduced.

Figure 1:
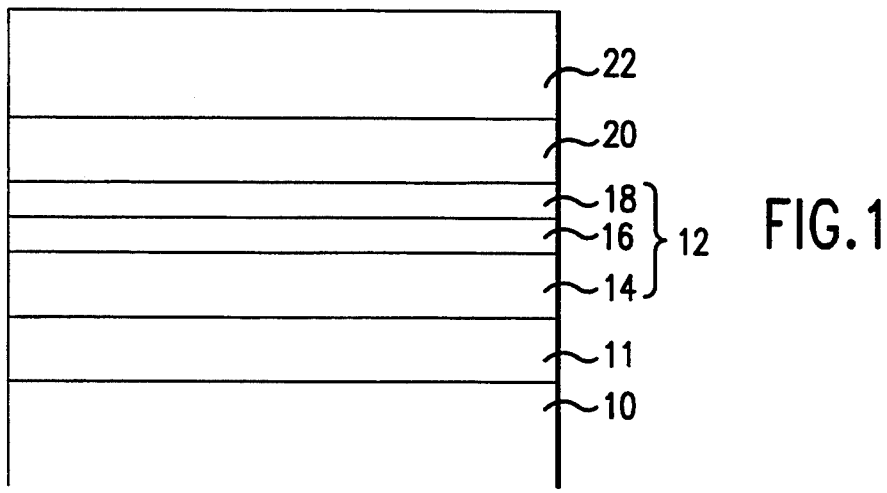
FIG. 1 is a schematic section of a Hall effect sensor in accordance with the invention.

According to a first embodiment, shown schematically in section in FIG. 1, the sensor comprises a substrate 10 of semiconductor material, on which lies a buffer layer 11, on which there is a quantum well structure 12.

The buffer layer 11 has sufficient thickness (at least equal to 1000 Å) to obtain good crystalline quality and good flatness of the surface.

The structure 12 is formed from a first layer called a confining layer 14 of a III-V semiconductor material and deposited on the substrate, a second intermediate layer 16 of a III-V semiconductor material deposited on the first confining layer, and a third layer 18 of a III-V semiconductor material which is a second confining layer deposited on the intermediate layer. A two-dimensional electron gas is formed in the quantum well.

The confining layers 14, 18 introduce a strong discontinuity in the conduction band with the intermediate semiconductor layer 16, in such a manner as to form a quantum well as deep as is possible in the region of the layer 16 with the greatest electron affinity.

A layer 20 called a carrier injection layer of semiconductor material doped with an n-type dopant allowing the formation of the two-dimensional electron gas in the quantum well is deposited in the quantum well structure 12. The second confining layer 18 allows the carriers forming the two-dimensional gas to be distanced from the doped region, which increases the mobility of the carriers. The increase in the carrier mobility reduces the offset in the Hall voltage measured over the device for a given polarization current $I_a$.

The thickness of the carrier injection layer 20 is less than some hundreds of Å. It may be nominally zero, the dopant being deposited in the thickness of an atomic plane of an adjacent layer, by the technique known as delta doping.

The doping level and the thickness are so chosen that the density per unit area of carriers integrated over the whole thickness of the carrier injection layer lies in a range from $10^{11}$ cm$^{-2}$ to $5 \times 10^{12}$ cm$^{-2}$.

The number of carriers in the quantum well depends in known manner on the density per unit area of donors integrated over the whole thickness of the carrier injection layer as well as the thicknesses and compositions of the various layers. This density per unit area of donors is chosen for example in such a manner as to obtain an density per unit area of carriers in the quantum well limited to a few $10^{11}$cm$^{-2}$.

The Hall coefficient (equation (1)) is inversely proportional to the carrier density per unit area. By limiting this density per unit area, the sensitivity is increased, which allows the power of the energizing source needed for operation of the sensor to be reduced for the same output Hall voltage.

A layer 22 called a burial layer is deposited on the carrier injection layer 20; this latter layer 22 of material with a large width of forbidden band prevents the formation of region of space charge depleted of carriers and thus electrically insulating. Moreover, the thickness of this layer is selected in a range from around 200 Å to some micrometers.

However, all things being equal, the thermal drift of the carrier density (and thus of the output signal of the sensor) is less with a greater thickness of such a burial layer. The thickness of the layer is only limited by the appearance of dislocations or other defects.

The energy level of the conduction band of the burial layer 22 is advantageously everywhere greater by at least 150 meV than the energy level of the conduction band in the quantum well. In this manner, the number of carriers present in the burial layer 22 is negligible compared with the number of carriers in the quantum well 16 and thus does not perturb the Hall effect measurement.

After effecting the deposition of the various layers described above, a Hall pattern with at least four contacts is manufactured. The Hall pattern may be formed by wet or dry etching of the set of layers 11 to 22; conductive contacts are then formed on the pattern.

The conductive regions can equally be delimited using an implantation technique, in such a manner as to render the set of layers non-conductive outside the Hall pattern. The ohmic contacts are then formed by metallization for energizing the device and measuring the Hall voltage.

The device may be passivated by deposition of a suitable dielectric layer, such as $SiO_2$ or $Si_3N_4$ for example.

Figure 2:
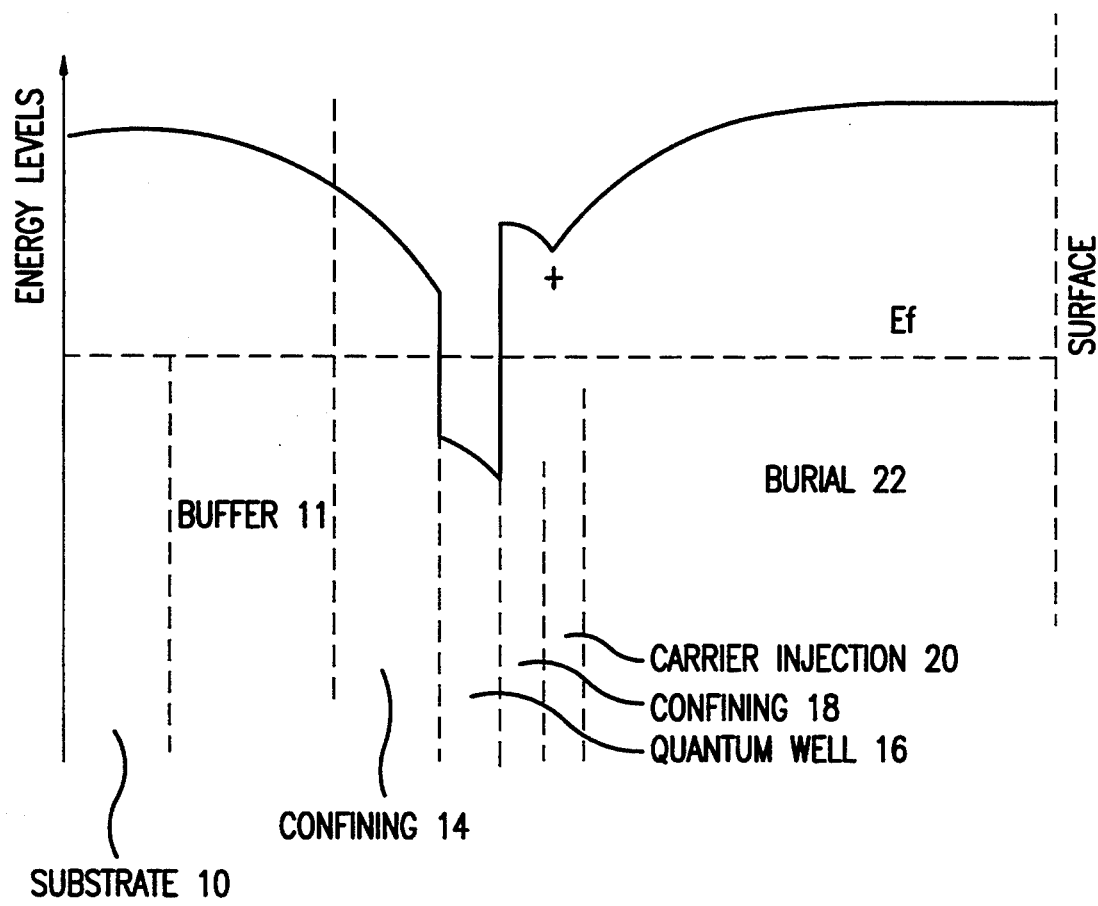
FIG. 2 is a schematic diagram of energy levels of the conduction band of a Hall effect sensor in conformity with the invention.

FIG. 2 is a schematic diagram of the energy levels of the conduction band of a Hall effect sensor according to the first embodiment.

The quantum well structure 12 with strong band discontinuity, such as is provided by the layers 14, 16, 18, makes possible a deep well in which the two-dimensional electron gas is well confined.

The doping atoms of the carrier injection layer 20 have energy states, not shown, which are resonant or localized in the forbidden band, near to the conduction band of the layer. In the configuration of the invention, these localized states have an energy level greater by at least 300 meV than those of the two-dimensional electron gas. In this way, the phenomenon known as gelling of the carriers, which corresponds to non-ionization of the dopant atoms, is avoided. However, the proportion of gelled carriers in these localized states varies as a function of temperature. Prevention of the appearance of this phenomenon thus makes it possible to avoid a source of temperature drift in the Hall signal.

The first embodiment pertaining to FIGS. 1 and 2 will be explained in more detail in the following examples, given as non-limiting examples.

EXAMPLE 1

The substrate 10 is of GaAs; the buffer layer 11 may then be selected from a layer of GaAs, a layer formed by an AlAs/GaAs superlattice or even a layer formed by the superimposition of GaAs deposited on the substrate and a layer formed by an AlAs/GaAs superlattice.

The first confining layer 14 may be an un-doped layer of GaAs. In a variant, this layer may possibly be merged with the buffer layer 11, which then fulfills the two functions of buffering and confinement. Its Thickness lies from 0 to some thousands of Å.

The intermediate semiconductor layer 16 is of undoped $In_xGa_{1-x}As$ with a value of x in a range from 0 to 1, preferably from 0 to 0.4, equal to 0.15 for example. Its thickness is in a range from 10 Å to 500 Å, 130 Å for example.

The third so-called confining layer 18 is of undoped $Al_yGa_{1-y}As$ with a value of y in a range from 0 to 0.4; y may be equal to 0.32 for example. The thickness of the layer 18 is less than 200 Å. It may be 40 Å for example.

In a variant, the third confining layer 18 is formed by a AlAs/GaAs superlattice of short period, for example of the n/m type where n represents the number of atomic layers of AlAs and m represents the number of atomic layers of GaAs. If n and m are small enough, for example from 1 to 10, this n/m AlAs/GaAs superlattice has electrical properties very close to those of the unstructured alloy $Al_yGa_{1-y}As$, with $y=n/(n+m)$, and is called a pseudo-alloy.

Figure 3:
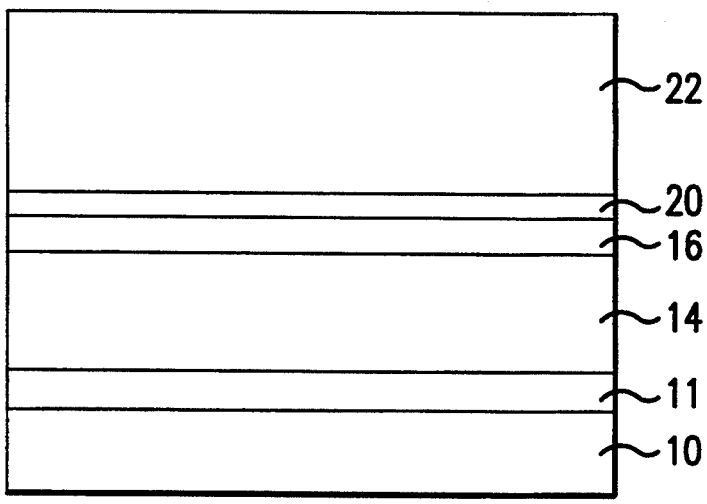
FIG. 3 is a schematic section of a modified embodiment of a Hall effect sensor in accordance with the invention.

In an extreme case shown schematically in FIG. 3, this confining layer may be omitted completely, its thickness being zero. The carrier injection layer 20 then rests directly on the intermediate semiconductor layer 16.

The carrier injection layer 20 is of $Al_uGa_{1-u}As$ doped with an n-type dopant selected from the elements of group IV (Si, Ge, Sn for example) or VI (S, Se, Te for example) of the periodic table. Silicon is advantageously chosen as the dopant when using the technique of molecular beam epitaxy.

The level of doping is so selected that the density per unit area of the dopant atoms integrated over the whole thickness of the carrier injection layer is from $10^{11} cm^{-2}$ to $10^{12} cm^{-2}$. The density per unit area of the donors may be $10^{12} cm^{-2}$ for example.

The value of u lies in the range from 0 to 0.4; it may be 0.32 for example.

The thickness of the carrier injection layer is less than some hundreds of Å it may be 40 Å for example.

Figure 4:
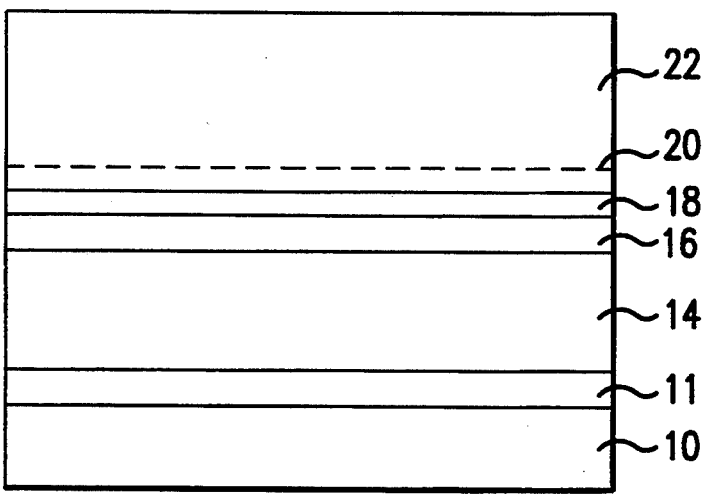
FIG. 4 is a schematic section of another modified embodiment of a Hall effect sensor in accordance with the invention.

According to a modified embodiment shown schematically in section in FIG. 4, the layer 20 is nominally of zero thickness; the dopant which alone forms the layer is represented by a broken line. The deposition of the dopant is effected within the thickness of an atomic plane of the second confining layer 18 by means of the technique known under the name "delta doping".

The use of a carrier layer of very small thickness, and even more the use of delta doping, makes it possible to minimize the trapping of carriers in the local states of the doping atoms and hence to obtain a low thermal drift of the Hall coefficient.

According to a modified embodiment, the carrier injection layer 20 is formed by an AlAs/GaAs superlattice with a short period forming a pseudo-alloy; (the superlattice may be of n/2n type, with n representing the number of atomic layers and being from 1 to 10).

The burial layer 22 is of un-doped $Al_qGa_{1-q}As$ with q in a range from 0 to 0.4 and equal to 0.32 for example.

The thickness of the burial layer 22 is in a range from 200 Å to 2 microns; it may be 3000 Å for example.

Figure 5:
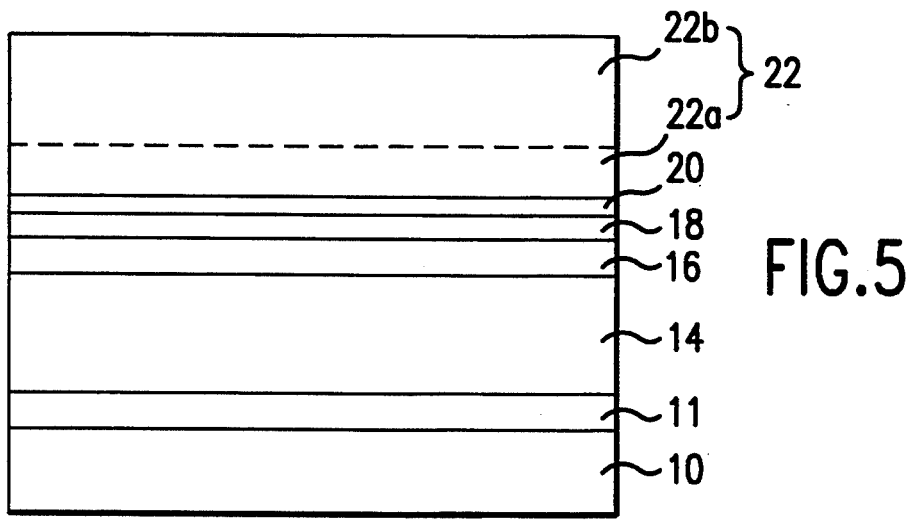
FIG. 5 is a schematic section of another modified embodiment of a Hall effect sensor in accordance with the invention.

According to a modified embodiment shown schematically in section in FIG. 5, in order to avoid any residual doping of p-type being able to occur in too thick a layer, the burial layer 22 is formed by first layer 22a of $Al_pGa_{1-p}As$ with a value of p in a range from 0 to 0.4 and equal to 0.32 for example.

The thickness of this first layer 22a is in a range from 200 Å to some thousands of Å; it may be 500 Å for example. A second layer 22b of $Al_wGa_{1-w}As$ has a composition gradient, i.e. w varies from the value p in the preceding layer 22a to zero. In this manner, the transition is ensured towards a layer of GaAs in which the residual doping is much better controlled during epitaxial deposition by molecular beams or by MOCVD.

The thickness of the layer 22b is in a range from 0 to 2 micrometers and is equal to 2500 Å for example.

The burial layer 22 can also be formed by an AlAs/GaAs superlattice with a short period (of the same type as the preceding superlattices), forming a pseudo-alloy.

EXAMPLE 2

In this example, the substrate is of silicon. The first confining layer 14 playing the role of a buffer is for example an AlAs/GaAs superlattice which ensures relaxation of the constraints due to the difference between the lattice parameters of crystals of Si on the one hand and of GaAs or AlAs on the other.

In general terms the superlattice may be of the type $Al_zGa_{1-z}As/GaAs$ with the value of z in a range from 0 to 1. The rest of the structure may be identical to that which has been described for EXAMPLE 1.

EXAMPLE 3

The substrate is of InP. The buffer layer 11 is a layer of InP for example. Its thickness can take the same values as the buffer layer 11 of EXAMPLE 1. The buffer layer 11 is of InGaAs.

In a modified embodiment, the buffer layer 11 may also be a superlattice of InGaAs/InAlAs type or may equally be composed of an InP layer covered by a superlattice of InGaAs/InAlAs type.

Time first confining layer 14 is a layer of un-doped InP. The intermediate semiconductor layer 16 is of $In_xGa_{1-x}As$ with a lattice constant matched to InP, i.e. with a value of x in a range from 0.5 to 0.56 and in the vicinity of 0.53 for example. The second confining layer 18 is a layer of $In_yAl_{1-y}As$ likewise with a lattice constant matched to InP, i.e. with a value of y in a range from 0.5 to 0.56 and in the vicinity of 0.52 for example.

The carrier injection layer 20 and the burial layer 22 are of $In_iAl_{1-i}As$ with a value of i in a range from 0.5 to 0.56, 0.52 for example.

The thicknesses of each of these layers are of the same order as those in EXAMPLE 1; thus, in a variant, the carrier injection layer 22 may be of nominally zero thickness by virtue of "delta doping".

A second embodiment will now be described with reference to FIGS. 6 and 7 respectively showing schematically a section of a Hall effect sensor according to this embodiment and the energy levels of the corresponding conduction band. The references identical with those of the preceding Figures designate the same types of layers.

Thus the layers are deposited on a substrate 10 of a material selected from GaAs, InP and Si, in a similar manner to the preceding examples. In this embodiment there are seen the buffer layer 11, the quantum well structure 12 formed by the layers 14, 16, 18, the carrier injection layer 20 and the burial layer 22 formed in a similar manner to the preceding examples.

Figure 6:
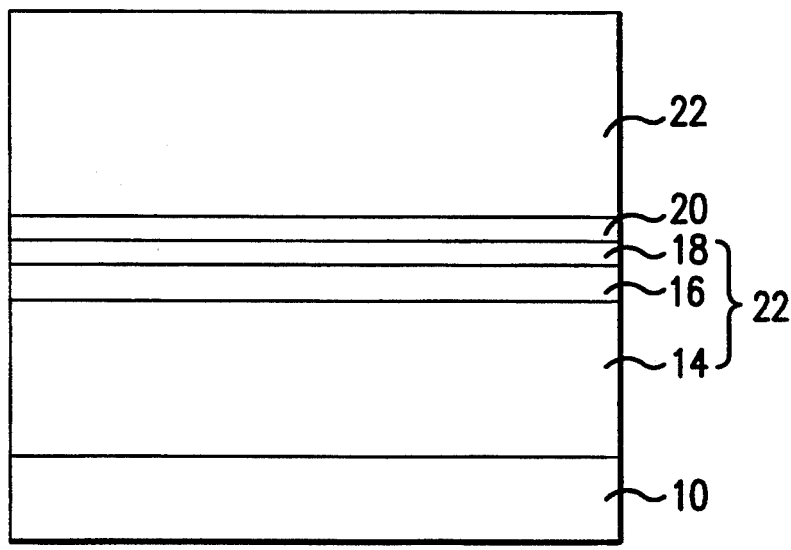
FIG. 6 is a schematic section of another modified embodiment of a sensor in accordance with the invention.
Figure 7:
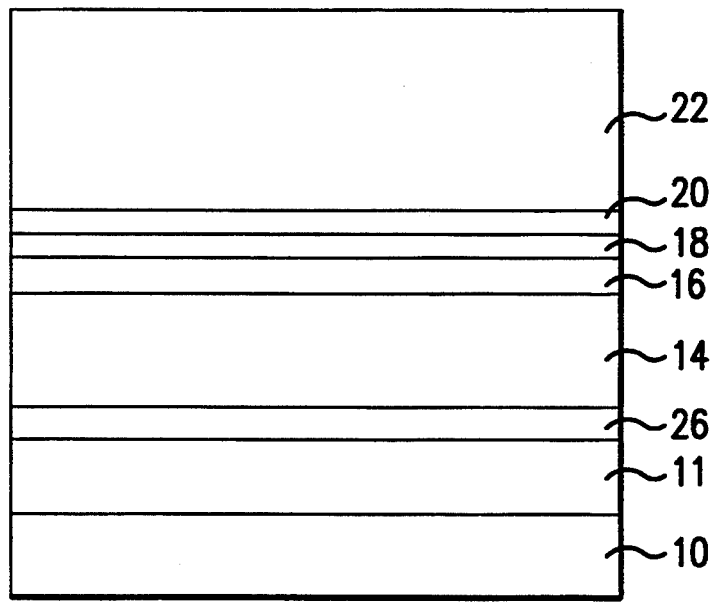
FIG. 7 is a schematic section of a second manner of implementing a Hall effect sensor in conformity with the invention.
Figure 8:
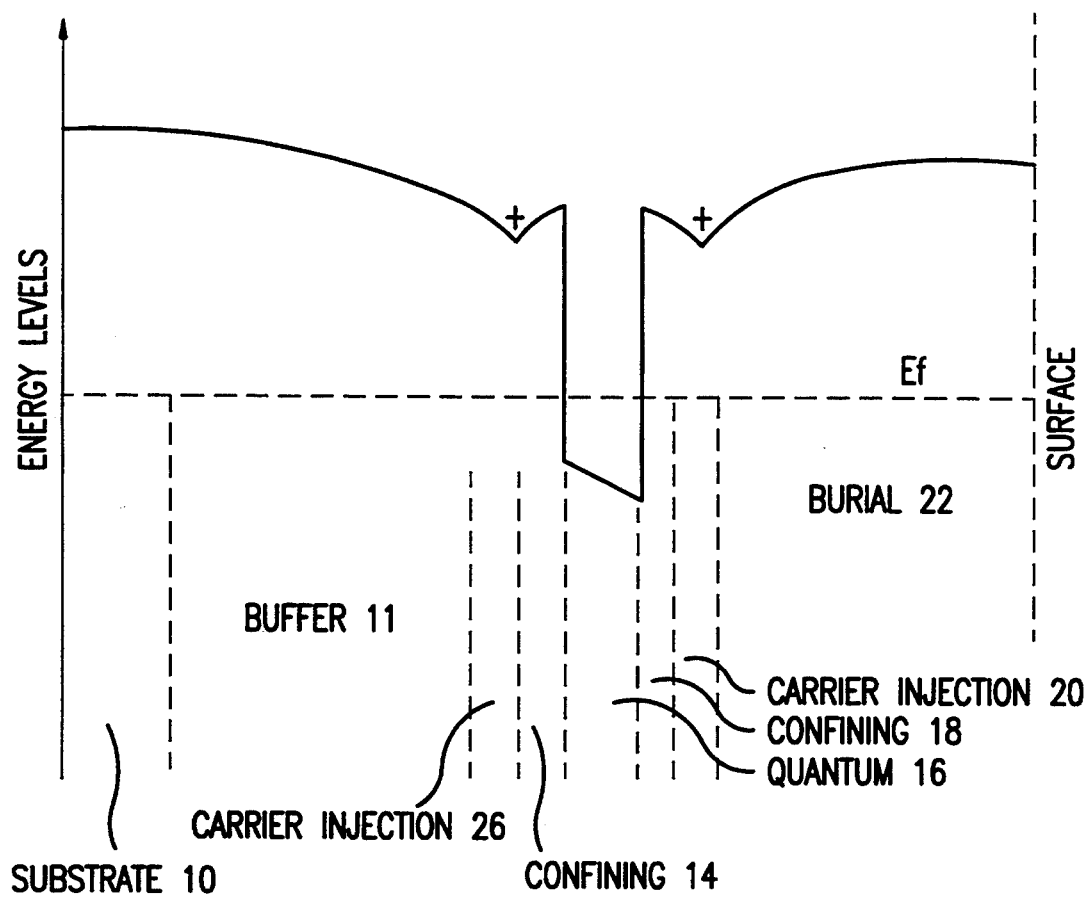
FIG. 8 is a schematic diagram of the conduction band of a sensor in conformity with the second mode of implementation.

As can be seen in FIGS. 6 and 7, the Hall effect sensor has a symmetrical structure. The buffer layer 11, as in the preceding examples, makes it possible to obtain a good surface state and matching of the lattice parameters between the materials of the layer 10 (substrate) and the following layer 26, which is a carrier injection layer identical with the layer 20.

Because of its special structure, a Hall effect sensor in conformity with the invention has a low sensitivity to temperature (less than 150 ppm/°C.) over an extended temperature range from at least 50° C. to +120° C. Moreover, the carrier mobility μ in the quantum well is very high (μ is greater than 7000 cm²/V.s), which greatly reduces the offset voltage for a given sensor geometry; (this may be compared with a silicon device in conformity with the prior art, for which μ<1400 cm²/V.s). It will thus be understood that, for an application to metering electrical energy or the measurement of electric currents, a sensor in accordance with the invention does not need a compensation circuit, which facilitates implementation of the meter and reduces its cost.

We claim:

1. A Hall effect sensor comprising:
   a) a quantum well structure having
      i) a first layer of a III-V semiconductor material,
      ii) a second layer of a III-V semiconductor material, and
      iii) a third layer of III-V semiconductor material deposited on a semiconductor substrate, the III-V material of the second layer having a forbidden band gap narrower than that of the III-V materials of the first and third layers;
   b) a fourth layer superimposed on the third layer and doped with donor type impurities, said fourth layer having a thickness less than 250 Å, and a carrier density per unit area integrated over the whole fourth layer less than $5 \times 10^{12} cm^{-2}$; and
   c) a fifth layer of III-V semiconductor material superimposed on said fourth layer, said fifth layer having a thickness greater than 200 Å, which is not doped or is doped with acceptor type impurities, wherein the conduction band of said fifth layer has a higher energy than the energy of the conduction band of the second layer, and said second layer of III-V semiconductor material has a forbidden band gap of smaller width than the forbidden band gap of said first layer, and said third layer of III-V semiconductor material has a forbidden band gap of greater width than the forbidden band gap of the first layer.

2. A sensor according to claim 1, wherein the first layer of III-V semiconductor material functions as a buffer between the substrate and the quantum well.

3. A sensor according to claim 1, wherein the fourth layer has a thickness which is nominally zero, the dopant being deposited in the thickness of an atomic plane of a layer adjacent to the fourth layer.

4. A sensor according to claim 1, wherein the substrate is Si or GaAs.

5. A sensor according to claim 4, wherein the second layer is $In_xGa_{1-x}As$ with a value of x in a range from 0 to 0.4 and a thickness in the range from 10 Å to 500 Å.

6. A sensor according to claim 4, wherein the third layer is $Al_yGa_{1-y}As$ with a value of y in a range from 0 to 0.4 and a thickness less than 200 Å.

7. A sensor according to claim 4, wherein the third layer is formed by a AlAs/GaAs superlattice with a short period forming a pseudo-alloy.

8. A sensor according to claim 4, wherein the fourth layer is $Al_uGa_{1-u}As$ with a value of u in a range from 0 to 0.4, the fourth layer being doped with an n-type dopant pertaining to a group of the periodic table selected from groups IV and VI.

9. A sensor according to claim 4, wherein the fourth layer is formed by an AlAs/GaAs superlattice with a short period forming a pseudo-alloy, the fourth layer being doped with an n-type dopant of the periodic table selected from groups IV and VI.

10. A sensor according to claim 4, wherein the fifth layer is $Al_uGa_{1-u}As$ with a value of u in a range from 0 to 0.4.

11. A sensor according to claim 4, wherein the fifth layer is formed by an AlAs/GaAs superlattice with a short period forming a pseudo-alloy.

12. A sensor according to claim 4, wherein the fifth layer comprises a first sublayer of an alloy or pseudo-alloy of $Al_pGa_{1-p}As$ with a value of p in a range from 0 to 0.4 and a second sublayer of $Al_wGa_{1-w}As$ having a composition gradient, w going from p to zero.

13. A sensor according to claim 1, wherein the substrate is InP.

14. A sensor according to claim 13, wherein the second layer is $In_xGa_{1-x}As$ with a value of x from 0.5 to 0.56 and a thickness in a range from 10 Å to 500 Å.

15. A sensor according to claim 14, wherein the third layer is $In_yGa_{1-y}As$ with a value of y from 0.5 to 0.56 and a thickness less than 200 Å.

16. A sensor according to claim 13, wherein the fourth layer is formed of $In_vAl_{1-v}As$ with the value of v in a range from 0.5 to 0.56, said fourth layer being doped with an n-type dopant selected from groups IV and VI of the periodic table.

17. A sensor according to claim 14, wherein the fifth layer is $In_zAl_{1-z}As$ with the value of z from 0.5 to 0.56.

18. A sensor according to claim 1, further comprising, symmetrical with said fourth layer, a sixth layer adjacent to the quantum well structure.

* * * * *